(12) United States Patent
Bernhardt et al.

(10) Patent No.: US 9,177,084 B2
(45) Date of Patent: Nov. 3, 2015

(54) GENERATING AN ANALYTICAL ENERGY MODEL

(75) Inventors: Kyle Bernhardt, Newton, MA (US); Lillian M. Smith, Cambridge, MA (US); Jack Conrad Gray, Cambridge, MA (US); Nathan Lockwood, Lunenburg, MA (US)

(73) Assignee: Autodesk, Inc., San Rafael, CA (US)

( * ) Notice: Subject to any disclaimer, the term of this patent is extended or adjusted under 35 U.S.C. 154(b) by 703 days.

(21) Appl. No.: 13/250,213

(22) Filed: Sep. 30, 2011

(65) Prior Publication Data
US 2013/0085718 A1   Apr. 4, 2013

(51) Int. Cl.
*G06F 17/50* (2006.01)

(52) U.S. Cl.
CPC .................................. *G06F 17/5004* (2013.01)

(58) Field of Classification Search
None
See application file for complete search history.

(56) References Cited

U.S. PATENT DOCUMENTS

| | | | |
|---|---|---|---|
| 2004/0239494 A1* | 12/2004 | Kennedy et al. | 340/500 |
| 2008/0249756 A1* | 10/2008 | Chaisuparasmikul | 703/13 |
| 2012/0232701 A1* | 9/2012 | Carty et al. | 700/277 |

* cited by examiner

*Primary Examiner* — Omar Fernandez Rivas
*Assistant Examiner* — Bernard E Cothran
(74) *Attorney, Agent, or Firm* — Fish & Richardson P.C.

(57) ABSTRACT

Methods, systems, and apparatus, including computer programs encoded on a system, for generating an analytical energy model from a conceptual representation or a mass form model. In one aspect, actions include receiving a conceptual representation of a building including one or more user-defined floor levels and multiple surfaces defining volumetric space, and, responsive to a request to generate an analytical energy model, automatically generating the analytical energy model by: deriving geometric information from the conceptual representation; defining one or more mass volumes; algorithmically assigning one or more surface types to mass volume surfaces; defining one or more thermal mass zones based on the mass volumes and a corresponding number of user-defined floor levels; deriving thermal properties of the one or more thermal mass zones; and combining the defined one or more thermal mass zones, the derived thermal properties, and predefined analytical energy model parameters to generate the analytical energy model.

27 Claims, 6 Drawing Sheets

FIG. 1

| Parameter | Value |
|---|---|
| Ground Plane | Level 1 |
| Location | Boston, MA, USA |
| Create Energy Model | ✓ |
| Core Offset | 12'-0" |
| Divide Perimeter Zones | ✓ |
| Conceptual Constructions | Edit... |
| Target Glazing Percentage | 40% |
| Target Sill Height | 3'-0" |
| Glazing is Shaded | ✓ |
| Shade Depth | 2'-0" |
| Target Percentage Skylights | 0% |
| Skylight Width & Depth | 3'-0" |
| Building Operating Schedule | 12/6 Facility |
| HVAC System | Central VAV, HW Heat, Chiller... |
| Outside Air Information | Edit... |

<< Preview    OK    Cancel    Apply

| Parameter | Param Type | Example Value |
|---|---|---|
| Area Per Person | Area | 71.76 ft² |
| Sensible Heat Gain Per Person | Heat Gain | 250.00 Btu/h |
| Latent Heat Gain Per Person | Heat Gain | 200.00 Btu/h |
| Lighting Load Density | Power Density | 0.90 W/ft² |
| Power Load Density | Power Density | 1.50 w/ft² |
| Plenum Lighting Contribution | Percent | 20.00% |
| Occupancy Schedule | Reference to predefined schedules | Common Office Occupancy |
| Lighting Schedule | Reference to predefined schedules | Common Office Occupancy |
| Power Schedule | Reference to predefined schedules | Common Office Occupancy |

GENERATING AN ANALYTICAL ENERGY MODEL

BACKGROUND

This disclosure relates generally to computer aided design (CAD) tools and techniques for generating an analytical energy model.

Whole building energy analysis is becoming increasingly important as energy prices increase and regional governments mandate conformance with stricter energy efficiency standards and/or reduction in carbon emissions. Modeling building heating, cooling, lighting, ventilation, and other energy flows typically requires the creation of an analytical model including various analytical energy model parameters to represent the physical structure, occupancy needs, and building services to meet those needs. For example, the structure parameters may represent the physical geometry of the building, including exterior form as well as internal thermal zoning, the type of surfaces that define the building geometry (e.g., wall, window, door, floor, roof, skylight), and the physical construction of those surfaces. Further, some parameters may represent the occupancy requirements for the building and the volumetric spaces that make up the building.

The analytical models are typically based on massing models used by Architects or Engineers to define the form of the building. In addition to the massing models, detailed information regarding the exterior form of the building, internal boundaries that make up thermal zones, location of glazing, and the physical construction of the various building elements (e.g., made of brick, double-paned glass, etc.) is generally required to obtain a valid analytical model. Generation of the analytical model is typically carried out in a rationalization process that adds the additional details to the information provided in the massing models. Due to the amount of information typically defined manually and processed, the rationalization process can be complex and time consuming, thus making it difficult to develop an energy model during early stages of the building design process.

SUMMARY

Systems and techniques are provided for generating an analytical energy model from a conceptual representation or a mass form model. By deriving and processing mass volumes from the conceptual representation and associating surface type and construction information with the mass volumes prior to deriving per-level thermal mass zones, more coherent, building-scale logical objects may be made available for a user and/or the CAD tool to assign surface types. For example, based on these systems and techniques, each side of a building may be associated with a single surface type and construction without the need to specify this information for each defined level in the mass form.

In general, one aspect of the subject matter described in this specification can be embodied in methods that include the actions of receiving a conceptual representation of a building including one or more user-defined floor levels and multiple surfaces defining volumetric space, and, responsive to a request to generate an analytical energy model, automatically generating the analytical energy model by: deriving geometric information from the conceptual representation; based on the geometric information, defining one or more mass volumes; algorithmically assigning one or more surface types to mass volume surfaces based, at least in part, on surface type definitions and the geometric information, the definitions specifying a material construction of a corresponding surface type; defining one or more thermal mass zones based on the mass volumes and a corresponding number of user-defined floor levels; based on the one or more surface types assigned to the mass volume surfaces and corresponding material construction, deriving thermal properties of the one or more thermal mass zones; and combining the defined one or more thermal mass zones, the derived thermal properties, and predefined analytical energy model parameters to generate the analytical energy model. Other embodiments of this aspect include corresponding systems, apparatus, and computer programs, configured to perform the actions of the methods, encoded on computer storage devices.

These and other embodiments can each optionally include one or more of the following features. Algorithmically assigning the one or more surface types can include defining a glazed portion of the exterior surface based on a predefined glazing percentage. Algorithmically assigning the one or more surface types to the exterior surface can include assigning a first surface type to a first portion of the exterior surface and assigning a second surface type to a second portion of the exterior surface. The actions can further include, for assigned surface types, associating the material construction of the surface type with a corresponding portion of the exterior surface in the conceptual representation. Defining the one or more mass volumes comprises partitioning the one or more mass volumes into core mass volumes and perimeter mass volumes based on a specified distance between a perimeter of the core mass volume and a perimeter of a corresponding one of the one or more mass volumes. Receiving the conceptual representation of a building including one or more user-defined floor levels can include receiving user input defining a mass form model of the building. The conceptual representation can be a mass form model defined by the multiple surfaces, the mass form model including a geographic orientation of the building. The predefined analytical energy model parameters can include default values and may be sufficient to generate the analytical energy model in combination with the conceptual representation. Receiving a conceptual representation of a building can include receiving conceptual representations of multiple buildings, each including one or more user-defined floor levels and multiple surfaces defining volumetric spaces and automatically generating the analytical energy model can include automatically generating an analytical energy model for each of the multiple buildings.

Particular embodiments of the subject matter described in this specification can be implemented to realize one or more of the following advantages. Analytical models may be generated early in the building design process and may allow a designer to quickly move freely between a freely modeled mass form to an analytical model without undergoing a complex and very time consuming manual process. Conceptual models developed during very early stages of a building design may be used to generate analytical models without having to specify large amounts of information. The analytical model may be generated automatically as the conceptual model is built and/or modified. Energy analysis may be performed quickly based on user modifiable defaults and a user defined conceptual model. Design decisions and/or changes such as, e.g., the number of stories, building orientation on a site, and plan proportions, and their impact on the energy analysis may be quickly compared early in the design process.

The details of one or more embodiments of the invention are set forth in the accompanying drawings and the description below. Other features, aspects, and advantages of the invention will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
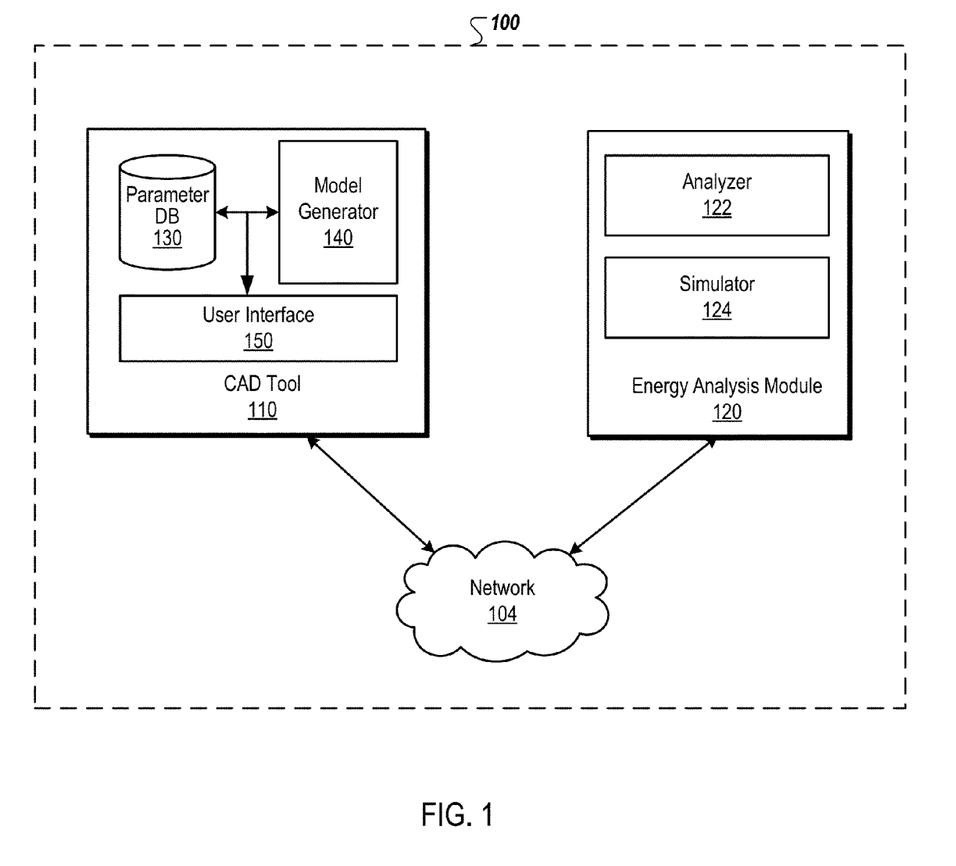
FIG. 1 is a diagram of an exemplary system for generating an analytical energy model.

FIG. 1 is a high-level illustration of a computer system 100 for generating an analytical energy model of a building based on a conceptual representation. Although this diagram depicts objects/processes as logically separate, such depiction is merely for illustrative purposes. It will be apparent to those skilled in the art that the objects/processes portrayed in this figure can be arbitrarily combined or divided into separate software, firmware, or hardware components. Furthermore, it will also be apparent to those skilled in the art that such objects/processes, regardless of how they are combined or divided, can execute on the same computing device or can be distributed among different computing devices connected by one or more networks 104 (e.g., the Internet).

System 100 includes a CAD tool 110 (e.g., a Building Information Model Application (BIMA)) and an energy analysis module (EAM) 120. CAD tool 110 includes, without limitation, a parameter database 130, a model generator 140, and a user interface 150. CAD tool 110 allows a user to generate and/or load a conceptual representation of a building design that can later be used as "form work" for a building information model. The conceptual representation includes information describing, for example, the exterior geometry of the building and the location of each floor level. The conceptual representation may be freely modeled by the user using CAD tool 110, or imported via a solid geometry file format (e.g., DWG). Geometric information is obtained by transforming 3D polygons describing surfaces and openings in the conceptual representation into rectangular geometry (i.e., planar, rectangular surface with height and width, tilt, and azimuth orientation). Parameter database 130 specifies multiple material construction parameters, design parameters, building services parameters, and other analytical energy model parameters sufficient to generate an analytical model from the conceptual representation. This feature allows users to quickly generate a model that can then be used to explore the energy efficiency of the conceptual representation at an early stage in the design process without the encumbrance of having to specify all of the design details an energy simulation program may require.

Model generator 140 converts the geometric information and corresponding material construction and design parameters into an analytical model. In some implementations, model generator 140 also transforms the analytical model into a simulation parameters format which is suitable for providing to EAM 120. In some examples, the transformation can be accomplished using a Web Style Sheet. A web style sheet describes how a document can be automatically converted from one format to another. Information on style sheets is available from http://www.w3.org. In some examples, the CAD model and the simulation parameters are the same, and thus no transformation is necessary.

Although this disclosure is not limited to or dependent on any particular model, in one example the model is an XML (extensible Markup Language) document. XML is an industry-wide standard document markup language. XML documents can be defined by a schema which is a set of rules and/or structure that formally defines the format of an XML document. In another example, the model is a gbXML (Green Building XML) document which is defined by the gbXML XML schema. The gbXML schema is available from http://www.gbxml.org and is a public domain standard developed to facilitate the transfer of building information stored in CAD models. In some examples, the model includes Industry Foundation Classes, the definition of which is available from the International Alliance for Interoperability of North America. Further, in some implementations, the model is compressed, encrypted and/or encoded.

Figure 2:
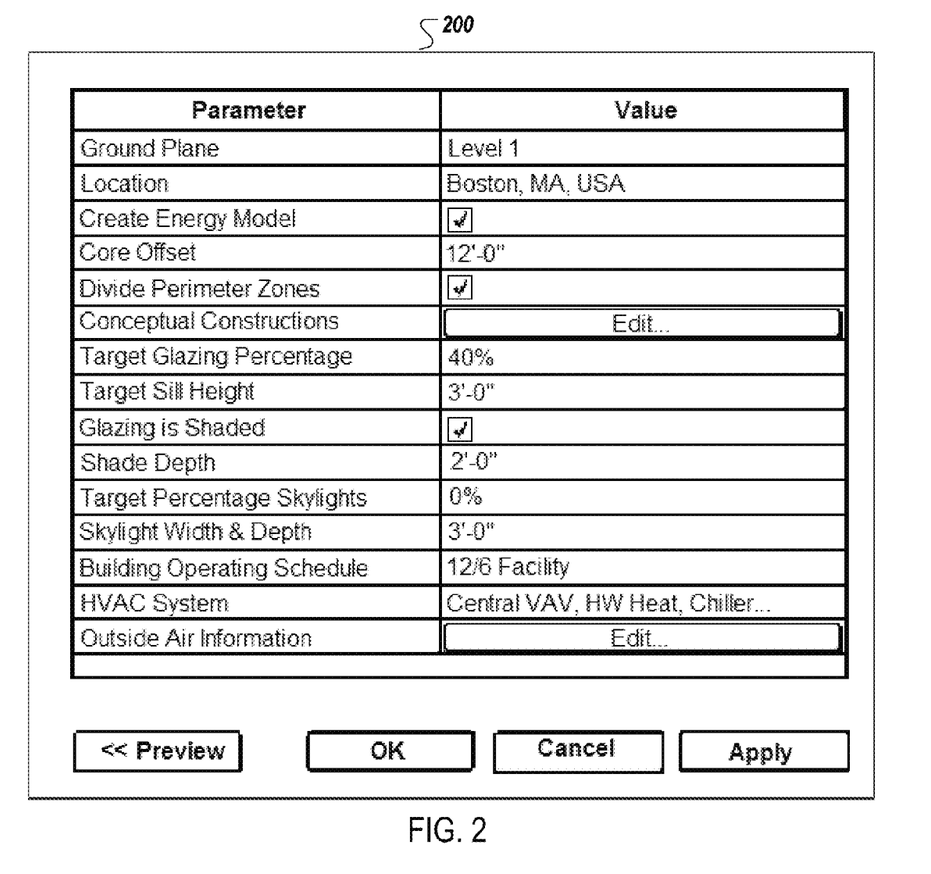
FIG. 2 is a user interface for a parameter database.

FIG. 2 illustrates an exemplary parameter user interface (PUI) 200 for parameter database 130. PUI 200 lists model parameters and associated values for use by model generator 140 in generating an analytical model. As illustrated, PUI 200 is pre-populated with default values. Some implementations include greater, fewer, or different parameters. In addition, in some implementations, some or all of the values are user modifiable. Further detail regarding the use and effect of other parameters listed in PUI 200 is provided below.

The "Create Energy Parameter" enables and disables the creation of the analytical model for CAD tool 110. When the parameter is unchecked, the other parameters in PUI 200 are grayed out. If turned off, the state of all dependent parameters is cached for later use should the user re-enable the parameter. When checked, CAD tool 110 generates an analytical model based on a conceptual representation of a building (i.e., a mass form) input or loaded by the user.

Figure 3:
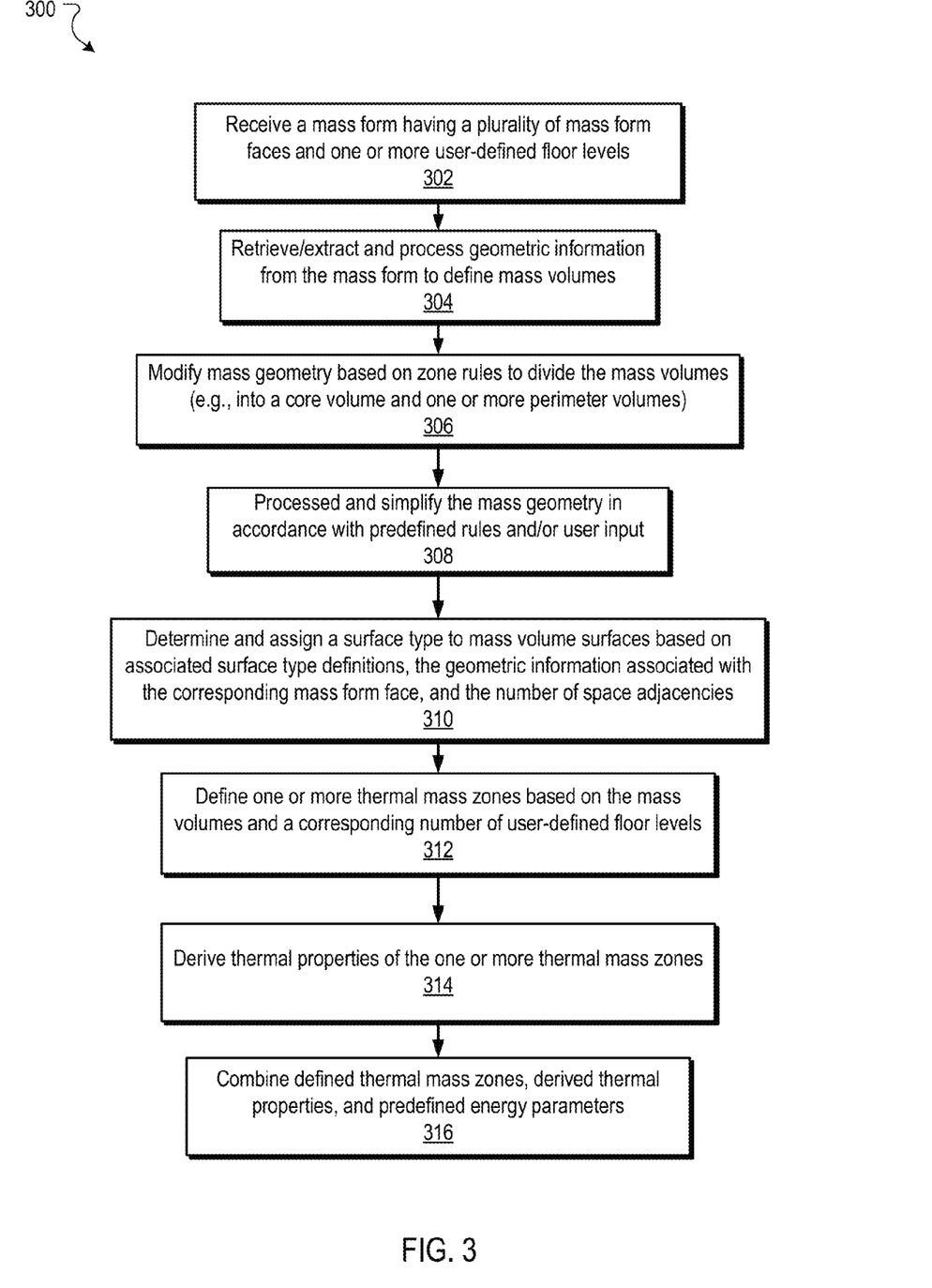
FIG. 3 is a flow diagram of a technique for automatically creating an analytical model from a conceptual representation of a building mass form.

FIG. 3 is a flow diagram 300 illustrating the automatic creation of an analytical model including one or more thermal mass zones from one or more mass forms. As illustrated, a CAD tool (e.g., CAD tool 110) receives a conceptual representation, for example, a mass form of a building defined by a plurality of mass form faces and including one or more user-defined floor levels (302). Geometric information is retrieved or extracted from the mass form as the mass form is loaded or created and is processed (304) to define volumetric spaces, or mass volumes. For example, for each defined space, the CAD tool determines the end-point coordinates of the space's enclosing walls (i.e., where the wall meets the floor). In some examples, exterior walls are measured on their exterior plane while interior walls are measured on their centerline plane. In such examples, interior walls are extended to an exterior wall's exterior plane for their connecting coordinate. Other techniques of extracting or associating geometric attributes with mass volumes defined by the relative orientation of mass form faces may also be used.

Zone rules (e.g., zone offset and zone perimeter splitting parameters) are applied to modify the mass geometry (306) to define an interior mass volume and one or more exterior mass volumes. Next, the mass geometry is processed and simplified in accordance with predefined rules and/or user input (308). For example, face adjacencies in the mass geometry can be simplified by identifying overlapping face pairs that can be treated as a single logical face. This is accomplished, for example, by splitting partially overlapped faces into pieces that are either fully overlapping with another face, or not overlapped. In some implementations, multilevel floors are simplified by making them into a single floor (e.g., a theatre with a stage). If the difference in height is equivalent to a new floor (e.g., a mezzanine), that section of the floor is divided into two spaces, one over the other. The floor and the ceiling planar polygon surfaces are divided depending on what is adjacent to them. For example, if the floor cantilevers over an exterior walkway and two separate spaces below it, the floor polygon is divided into three floor polygons, one for the cantilever portion, and one for each of the spaces below the floor. In this example, the area of the space is based on the sum of the areas above the floor polygons. The CAD tool also determines the surface width, height, and azimuth of planar polygons representing each wall's surface. In some examples, a wall can be subdivided to accommodate unique orientations, material constructions, and/or differences in adjacent spaces as described above with respect to floors.

Based the geometric information, the CAD tool determines and assigns a surface type to each mass volume surface based on associated surface type definitions, the geometric information associated with the corresponding mass volume surface, and the number of space adjacencies (310). Assignable surface types include, for example, mass exterior wall, mass interior wall, mass roof, mass glazing, mass opening, mass floor, mass shade, and mass skylight. The material construction of each type of surface is defined by a parameter database (e.g., parameter database 130) and, in some implementations, material construction definitions are accessible for viewing or modification by selecting an "Edit" option associated with the material construction definitions, for example as illustrated in PUI 200.

Material construction definitions associated with assigned surface types are associated with corresponding mass volume surfaces (312) and are used by a model generator (e.g., model generator 140) to derive thermal properties of mass zone faces coincident to the mass volume surface (314). In some implementations, the surface type assigned to a mass volume surface and/or the material construction definition associated with the mass volume surface may be overridden by the user, for example, by manually assigning a surface type or material construction definition to the mass volume surface. In some cases, the surface types that a user may select to override the automatically assigned surface types are limited to specific alternatives as described in the model generator 140 assignment techniques below.

Surface types are assigned based on a comparison between surface type definitions and geometric information extracted or retrieved from the mass form model. For example, based on the geometric information, if a mass volume surface is non-horizontal and has at most one mass volume adjacency, the model generator assigns the "mass exterior wall" surface type to the mass volume surface. In some implementations, a user may modify the mass exterior wall assignment to mass roof Further, in some implementations, if the mass volume surface is associated with a mass floor level below the level specified by the Ground Plane parameter (as set in PUI 200), the model generator associates a "mass exterior wall—underground" surface type with the mass volume surface. In some examples, if the mass floor level is only partially underground, the corresponding mass volume surface are split into two instances and the portions below ground are associated with the mass exterior wall—underground surface type.

If the mass volume surface is horizontal, has a mass volume adjacency on one side only, and is above the mass volume adjacency, the model generator assigns the "mass roof" surface type to the mass volume surface. In some examples, a user may modify the assignment to "mass exterior wall." If the mass floor level associated with the mass volume surface is below the level specified by the Ground Plane parameter (as set in PUI 200), the model generator associates a "mass roof—underground" surface type with the mass volume surface.

Mass floor surface types are assigned to mass floors when the floor levels are specified by the user. If the mass floor has a mass volume adjacency on one side only, the model generator associates the "mass floor—slab" surface type with the mass floor.

If a mass volume surface is non-horizontal and has mass volume adjacencies on each side, the model generator assigns the mass interior wall surface type to the mass volume surface. In some implementations, a user may modify the mass interior wall assignment to mass opening.

If a mass volume surface has no mass volume adjacencies, the model generator assigns the mass shade surface type to the mass volume surface. Preferably, mass shades that are associated with a level below the level specified by the ground plane parameter should be manually hidden or removed by the user before performing an analysis.

In some implementations, the model generator automatically applies glazing (i.e., windows) to portions of the exterior surfaces of the mass form. For mass exterior walls, mass glazing is generated based on the "target glazing percentage" parameter and the "target sill height" parameter. In some cases, the default target glazing percentage is 40%. The model generator divides the mass volume surface to create a subdivision occupying the specified percentage of the total surface area, spaced equally from the left and right edges of the mass volume surface, and having the specified sill height. If a conflict occurs between the specified percentage and the specified sill height, the model generator gives precedence to the specified percentage value. For mass roofs, mass skylights are generated by the model generator based on the "target percentage skylights" parameter and the "skylight width & depth" parameter. The model generator divides the mass volume surface to create a subdivision occupying the specified percentage of the total surface area and offset equally on all sides until the specified percentage is met. The skylight width & depth parameter specifies the measurements of each square-shaped skylight in the array of skylights generated to meet the specified percentage. In some examples, a user may modify either assignment to mass opening.

If the "glazing is shaded" parameter is checked in PUI 200, model generator automatically generates mass shading based on the "shade depth" parameter for all mass glazing. The model generator creates shades by extruding a planar surface out from the top edge of each automatic glazing and parallel to the ground, to the distance specified by shade depth.

Based the geometric information and the one or more user defined floor levels, the CAD tool defines thermal mass zones in the analytical model representing volumetric spaces within the mass form (316). This is accomplished, for example, by dividing the previously defined mass volumes by a number of user defined floor levels as specified in the conceptual representation. Some implementations include further post-processing of the thermal mass zones including surface type reconciliation, e.g., based on the surface type criteria specified above and/or further splitting of zone faces.

In general, subdividing the mass volume prior to defining the thermal mass zones, as described above, produces more coherent, building-scale logical objects for the user and/or the CAD tool to assign surface types to. In this way, each side of a building may be associated with a single surface type and construction without the need to specify this information for each defined level in the mass form.

As described above with respect to FIG. 3, once surface types are assigned to each of the mass volume surface and material construction definitions associated with each mass volume surface, the model generator derives the thermal properties of each thermal mass zone in the analytical model based on the geometry of corresponding volumetric spaces in the mass form, assigned surface types and corresponding material construction definitions, the location of corresponding floor levels, and data stored in the parameter database.

Figure 4A:
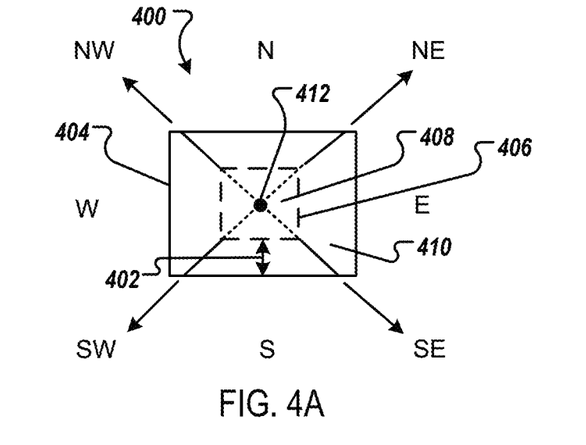
FIGS. 4A and 4B illustrate partitioned mass volumes for two example mass forms.
Figure 4B:
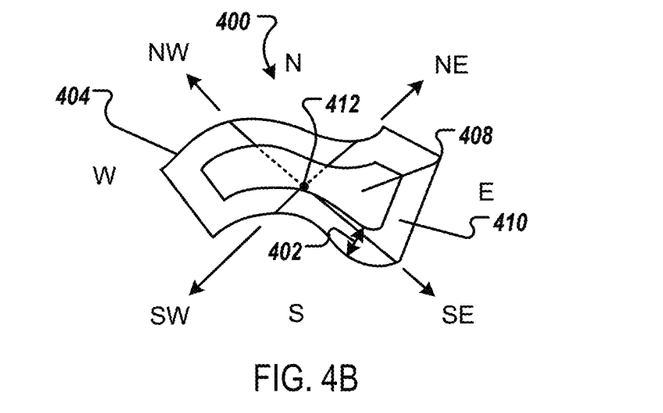

FIGS. 4A and 4B illustrate two exemplary mass volume partitions based on values associated with a "core offset" parameter and a "divide perimeter zones" parameter. The core offset parameter specifies the distance 402 between a perimeter 404 of a mass volume 400 and a perimeter 406 of a core mass volume 408. A value of zero disables the creation of core mass volume 408. Setting this value to zero in addition to setting the number of perimeter mass zones to 1 creates a single mass volume, and correspondingly, a single thermal mass zone, at each mass floor level. In some examples, model generator 140 will not create the core mass volume if a conflict occurs, for example, the core offset is too large for the dimensions of the mass floor, the mass form has already been "cut" via it's geometry (such as by defining an internal atrium), or there is another form inside the mass form bisecting the mass floor (e.g., an internal core has been modeled)

In some implementations, the divide perimeter zones parameter is hardcoded to define four quadrants 410 such that the mass volume is divided along the axes of True NW to SE and True SW to NE and intersect at the centroid 412 of mass volume 400. In this way, four perimeter mass zones at True N, S, E, and W are automatically created when the divide perimeter zones parameter is enabled. The division of the mass volume into quadrants does not affect core zone 408.

Figure 5:
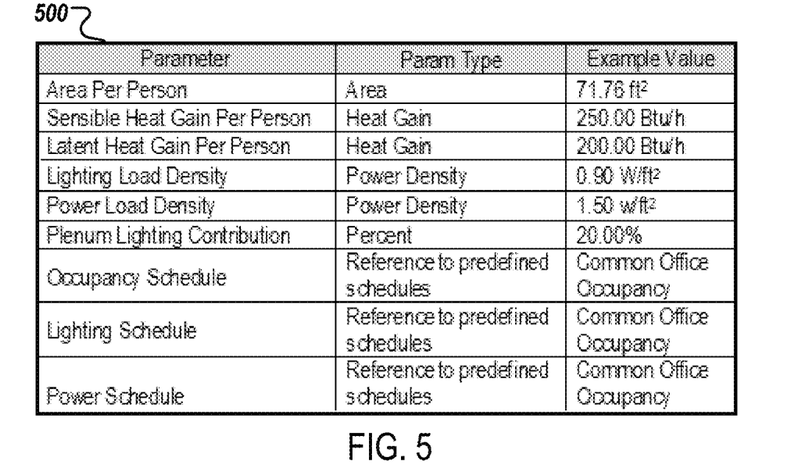
FIG. 5 illustrates a parameter table of exemplary "space type" parameters.

In some examples, the thermal mass zones in the analytical model are further defined based on one or more additional parameters in parameter database 130. For example, some implementations include "space type" parameters, such as those illustrated in parameter table 500 of FIG. 5, defining the usage, and subsequent energy load density, of the thermal mass zones created by model generator 140.

In some implementations, parameter database 130 further includes predefined "building services" parameters for use by model generator 140 in generating the analytical model. For example, an "HVAC system" parameter specifies the default HVAC system. In some examples, the user may modify this setting to select an alternate system from a predefined enumerated list. The "condition type" parameter defines the type of HVAC service that will be delivered to a given thermal mass zone, and thus, impacts how the thermal mass zone is simulated during energy analysis. The "cooling information" parameter defines the temperature set points that are used when the building is in cooling mode. The "heating information" parameter defines the temperature set points that are used when the building is in heating mode.

These and other parameters may be accessed via PUI 200 and/or other dialog interfaces. For example, parameters may include outside air parameters for defining the amount of ventilation air (air from outside the building) that will be supplied to thermal mass zones. Some implementations include one or more of the following parameters: outdoor air per person parameter—defining the specified air flow per person within a conditioned thermal mass zone; people parameter—defining the number of people within the thermal mass zone; outdoor air per area parameter—defining a specified air flow per area within a conditioned thermal mass zone; air changes per hour parameter—defining a specified number of complete "renewals" of the air volume within a thermal mass zone, per hour.

Referring again to FIG. 1, once generated, the analytical model is provided to EAM 120. In some implementations, this activity is initiated by a user through one or more interactions with user interface 150 (e.g., a web page, application program, or other suitable GUI interface). In some examples, user interaction is accomplished with an input device (not shown) that is operatively coupled to at least one GUI. By way of a non-limiting example, the interaction can include clicking on a mouse button, typing a key on a keyboard, touching or tapping a digitizer, making contact with a touch-sensitive device, making a sound, sending a command through a remote control device or other computing device, depressing a button, performing a hand or facial gesture, sending a command from a personal digital assistant, etc. In some examples, the analytical model may also be provided to EAM 120 without requiring any user interaction to initiate the process. For example, CAD tool 110 itself, or some other process/thread of execution operating on the same computing device as the CAD tool or on a different computing device may provide the analytical model to EAM 120.

In the example illustrated in FIG. 1, EAM 120 is implemented as a server or as a web service (e.g., Autodesk® Green Building Studio® web-based service). In some implementations, EAM 120 is partially or wholly incorporated into CAD tool 110. Although EAM 120 is not tied to any particular implementation, one possible implementation is as an ActiveX DLL (dynamic link library). Programming tools and libraries that support ActiveX are available from Microsoft Corp. of Redmond, Wash. In another implementation, EAM 120 is implemented as a Java® Bean or as a Java Servlet. The Java programming language and run-time environment are available from Sun Microsystems, Inc. of Santa Clara, Calif.

In some examples, the analytical model may be provided to EAM 120 via any number of network protocols including but not limited to: SOAP (Simple Object Access Protocol), HTTP (Hypertext Transfer Protocol), HTTP/S (Hypertext Transfer Protocol/Secure), TCP/IP (Transmission Control Protocol/Internet Protocol), UDP (User Datagram Protocol), etc. In some implementations, the analytical model may be provided via shared memory or via a file system. In yet another implementation, the analytical model may be provided to EAM 120 via an instantiated class object. Regardless of how the model is provided to EAM 120, it may also be provided in a compressed, encrypted and/or encoded form.

In some implementations, EAM 120 includes an analyzer 122 and one or more simulators 124 to perform an energy analysis based on the properties and/or simulation parameters defined in the analytical model. In one implementation, a simulator determines the energy use and/or cost of a building on an periodic or other basis using information supplied by parameter database 130, including, for example, the building's geographical location (i.e., climate), geographic orientation, its three-dimensional geometry, construction materials, utility rate schedule, and HVAC equipment. One suitable simulator is DOE-2, named for the government agency that sponsored its development (U.S. Department of Energy). DOE-2 is commercially available Lawrence Berkeley National Laboratory (Berkeley, Calif.) and James Hirsch & Associates. EnergyPlus® 120 is another suitable simulator. Its development was also sponsored in part by the U.S. Department of Energy and it is available from the Lawrence Berkeley National Laboratory. In some implementations, analyzer 122 provides a plug-able software architecture via an application program interface (API), service provider interface (SPI), or other mechanism, to accommodate new simulators 124 as they become available.

Once computed, the simulation results are provided by EAM 120 to CAD tool 110. In some examples, the simulation results are transformed back into the original analytical model format. In some cases, the results of the simulation are incorporated into the analytical model as part of this transformation. In some example implementations, the model is provided to CAD tool 110 via one of a number of network protocols including but not limited to: SOAP, HTTP, HTTP/S, TCP/IP, UDP, or other suitable protocols. In some implementations, the model is provided via shared memory or via a file system. Further, in some implementations, the model is provided to CAD tool 110 via an instantiated class object. Regardless of how the model is provided to the tool, it may also be provided in a compressed, encrypted and/or encoded form.

In some examples, the model and/or simulation results are presented for viewing by the user via user interface 150 or other suitable GUI interface. In some examples, simulation results are summarized such that a CAD tool user (e.g., an architect) can quickly ascertain key indicators of a given model's energy efficiency. The summary can be produced by CAD tool 110 and/or EAM 120. If the model is a gbXML document, the results of the simulation can be associated with the Results gbXML element and reference the relevant gbXML document elements. Results can apply to buildings and/or spaces within the buildings and can be a function of any period of time. Results can also be persisted in storage.

Having received and reviewed the results of the analysis, the user may then modify the conceptual representation, including its orientation and/or location, the surface type assignments or corresponding material construction definitions, and/or other design parameters for further analysis and comparison. In this way, design decisions and/or changes such as, e.g., the number of stories, building orientation on a site, and plan proportions, and their impact on the energy analysis may be quickly compared early in the design process. In some implementations, other design features and their effect on energy use may also be compared, including, for example, glazing percentages and basic shading depths, construction details (external wall insulation and building materials), service equipment, and/or building form.

Figure 6:
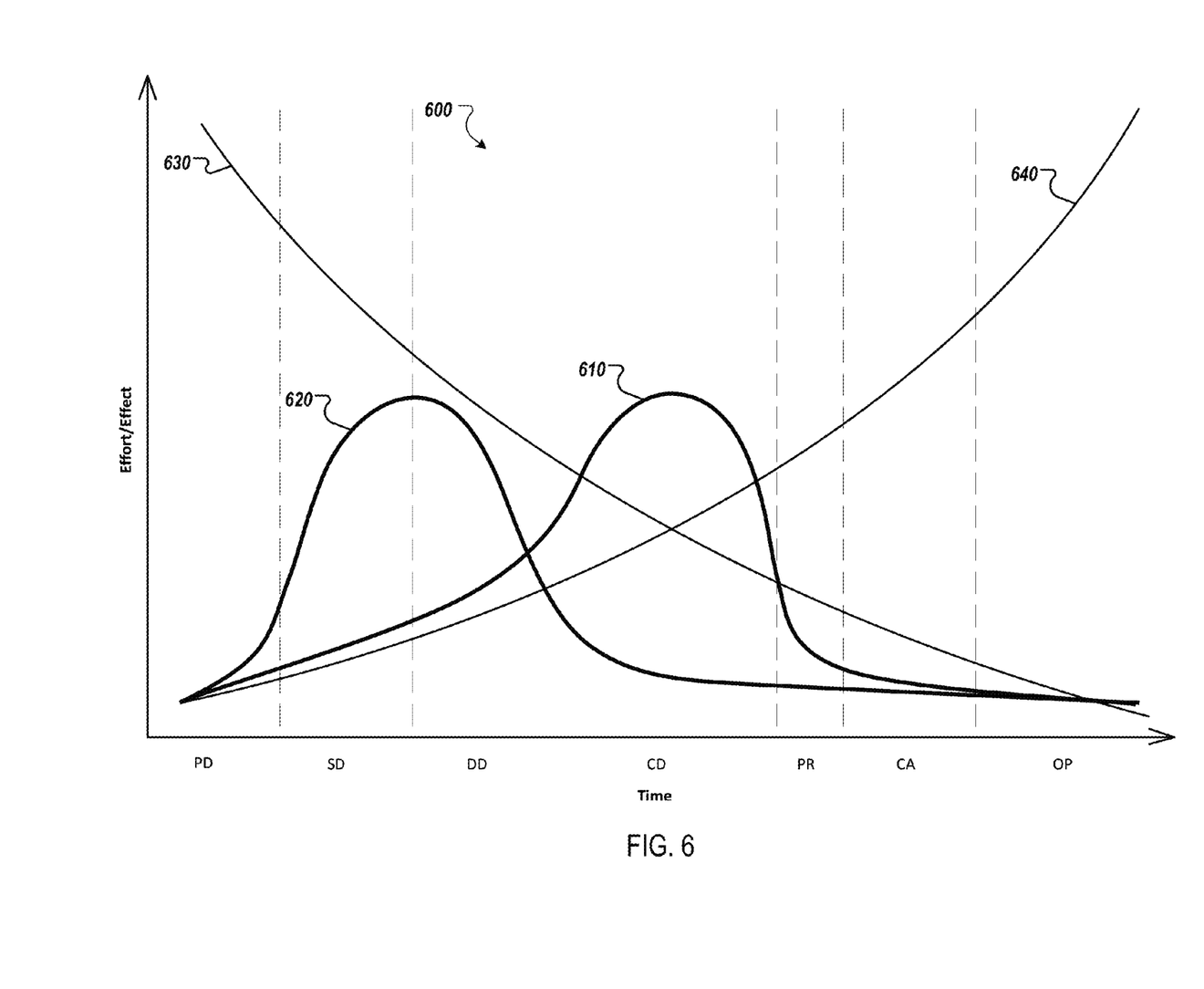
FIG. 6 illustrates a comparison of a traditional design process and an alternative design process.

FIG. 6 illustrates a comparison of a traditional design process 610 and an alternative design process 620 that may be facilitated by the systems and techniques presented herein. As indicated in graph 600, the ability to impact cost and functional capabilities 630 decreases as the process progresses through the stages of pre-design (PD), schematic design (SD), design development (DD), construction documentation (CD), procurement (PR), construction administration (CA), and operation (OP). Further, the cost of design changes 640 increases as the process progresses through the multiple stages. Thus, by facilitating early-stage energy analysis and integrating the analysis with conceptual design tools, greater effort can be expended in the early stages of the process to reduce energy consumption and optimize design details.

Figure 7:
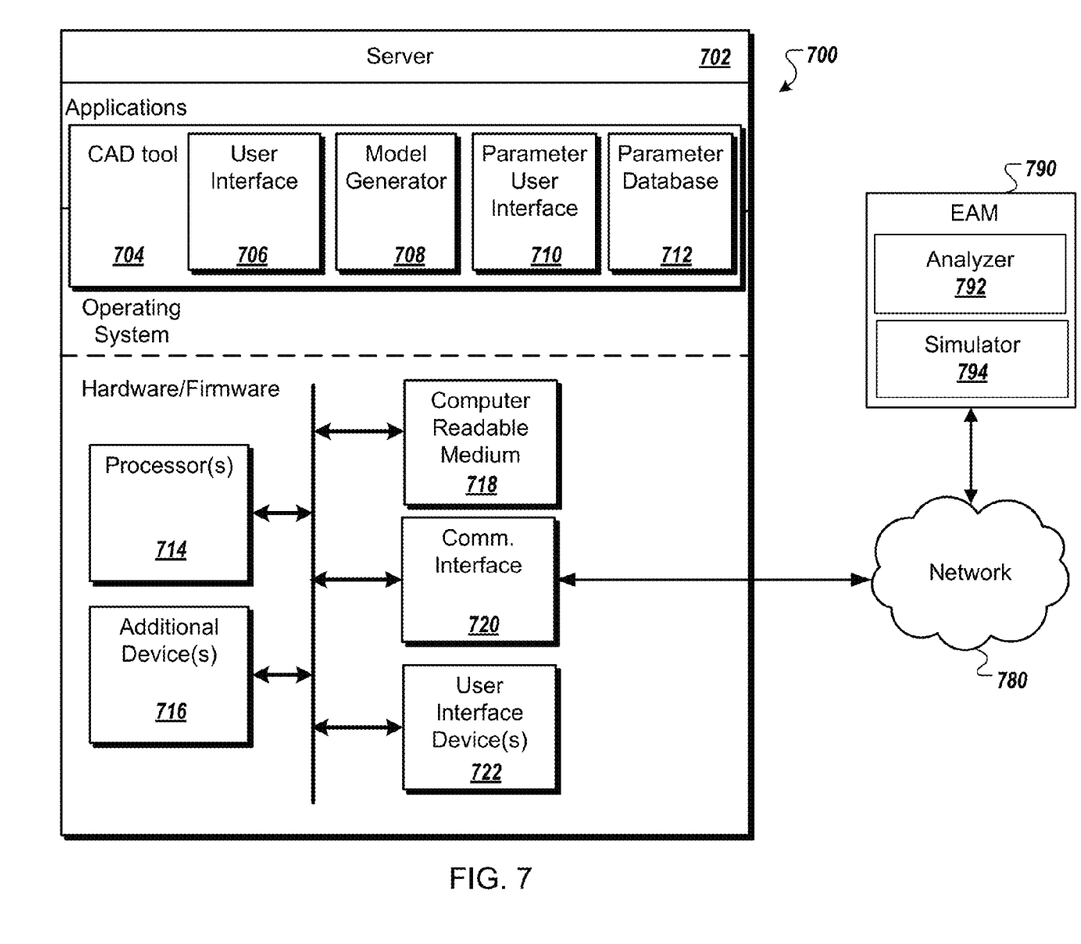
FIG. 7 is a schematic diagram of an example system configured to generate an analytical energy model.

FIG. 7 is a schematic diagram of an example system configured to generate an analytical energy model of a building based on a conceptual representation. The system generally consists of a server 702. The server 702 is optionally connected to one or more energy analysis modules 790 through a network 780. The server 702 consists of one or more data processing apparatus. While only one data processing apparatus is shown in FIG. 7, multiple data processing apparatus can be used. The server 702 includes various modules, e.g. executable software programs, including a CAD tool 704 (e.g., a Building Information Model Application (BIMA)) to allow a user to generate and/or load a conceptual representation of a building design. CAD tool 704 includes a user interface 706, a model generator 708, a parameter user interface 710, and a parameter database 712.

Each module runs as part of the operating system on the server 702, runs as an application on the server 702, or runs as part of the operating system and part of an application on the server 702, for instance. Although several software modules are illustrated, there may be fewer or more software modules. Moreover, the software modules can be distributed on one or more data processing apparatus connected by one or more networks or other suitable communication mediums.

The server 702 also includes hardware or firmware devices including one or more processors 714, one or more additional devices 716, a computer readable medium 718, a communication interface 720, and one or more user interface devices 722. Each processor 714 is capable of processing instructions for execution within the server 702. In some implementations, the processor 714 is a single or multi-threaded processor. Each processor 714 is capable of processing instructions stored on the computer readable medium 718 or on a storage device such as one of the additional devices 716. The server 702 uses its communication interface 720 to communicate with one or more computers 790, for example, over a network 780. Examples of user interface devices 722 include a display, a camera, a speaker, a microphone, a tactile feedback device, a keyboard, and a mouse. The server 702 can store instructions that implement operations associated with the modules described above, for example, on the computer readable medium 718 or one or more additional devices 716, for example, one or more of a floppy disk device, a hard disk device, an optical disk device, or a tape device.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially-generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application-specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some embodiments, a server transmits data (e.g., a CAD model, analytical model, simulation results, analysis report) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A computer-implemented method, comprising:
   receiving a conceptual representation of a building including one or more user-defined floor levels and multiple surfaces defining geometrical volumetric spaces; and
   responsive to a request to generate an analytical energy model, automatically generating, by one or more processors, the analytical energy model by:
   deriving geometric information from the conceptual representation;
   based on the geometric information, determining one or more mass volumes;
   algorithmically assigning one or more surface types to mass volume surfaces based, at least in part, on surface type definitions a number of space adjacencies and the geometric information associated with a corresponding mass volume surface, the surface type definitions specifying a material construction of a corresponding surface type;
   defining one or more thermal mass zones based on the determined one or more mass volumes and a corresponding number of user-defined floor levels;
   deriving, using a model generator, thermal properties of the one or more thermal mass zones;
   wherein the deriving is based one the geometrical volumetric spaces, the one or more surface types assigned to the mass volume surfaces, and corresponding material construction; and
   combining the defined one or more thermal mass zones, the derived thermal properties, and predefined analytical energy model parameters to generate the analytical energy model.

2. The method of claim 1, wherein algorithmically assigning the one or more surface types comprises defining a glazed portion of an exterior surface based on a predefined glazing percentage.

3. The method of claim 1, wherein algorithmically assigning the one or more surface types comprises assigning a first surface type to a first portion of an exterior surface and assigning a second surface type to a second portion of the exterior surface.

4. The method of claim 1, further comprising, for assigned surface types, associating the material construction of the surface type with a corresponding portion of an exterior surface in the conceptual representation.

5. The method of claim 1, wherein determining the one or more mass volumes comprises partitioning the one or more mass volumes into core mass volumes and perimeter mass volumes based on a specified distance between a perimeter of the core mass volume and a perimeter of a corresponding one of the one or more mass volumes.

6. The method of claim 1, wherein receiving the conceptual representation of a building including one or more user-defined floor levels comprises receiving user input defining a mass form model of the building.

7. The method of claim 1, wherein the conceptual representation is a mass form model defined by the multiple surfaces, the mass form model including a geographic orientation of the building.

8. The method of claim 1, wherein the predefined analytical energy model parameters include default values and are sufficient to generate the analytical energy model in combination with the conceptual representation.

9. The method of claim 1, wherein receiving a conceptual representation of a building includes receiving conceptual representations of multiple buildings, each including one or more user-defined floor levels and multiple surfaces defining geometrical volumetric spaces, and wherein automatically generating the analytical energy model comprises automatically generating an analytical energy model for each of the multiple buildings.

10. A non-transitory computer storage medium encoded with a computer program, the program comprising instructions that when executed by data processing apparatus cause the data processing apparatus to perform operations comprising:
    receiving a conceptual representation of a building including one or more user-defined floor levels and multiple surfaces defining geometrical volumetric spaces; and
    responsive to a request to generate an analytical energy model, automatically generating the analytical energy model by:
    deriving geometric information from the conceptual representation;
    based on the geometric information, defining one or more mass volumes;
    algorithmically assigning one or more surface types to mass volume surfaces based, at least in part, on surface type definitions, a number of space adjacencies and the geometric information, associated with a corresponding mass volume surface, the surface type definitions specifying a material construction of a corresponding surface type;
    defining one or more thermal mass zones based on the determined one or more mass volumes and a corresponding number of user-defined floor levels;
    deriving, using a model generator, thermal properties of the one or more thermal mass zones;
    combining the defined one or more thermal mass zones, the derived thermal properties, and predefined analytical energy model parameters to generate the analytical energy model.

11. The computer storage medium of claim 10, wherein algorithmically assigning the one or more surface types comprises defining a glazed portion of an exterior surface based on a predefined glazing percentage.

12. The computer storage medium of claim 10, wherein algorithmically assigning the one or more surface types comprises assigning a first surface type to a first portion of an exterior surface and assigning a second surface type to a second portion of the exterior surface.

13. The computer storage medium of claim 10, the operations further comprising, for assigned surface types, associating the material construction of the surface type with a corresponding portion of an exterior surface in the conceptual representation.

14. The computer storage medium of claim 10, wherein determining the one or more mass volumes comprises partitioning the one or more mass volumes into core mass volumes and perimeter mass volumes based on a specified distance between a perimeter of the core mass volume and a perimeter of a corresponding one of the one or more mass volumes.

15. The computer storage medium of claim 10, wherein receiving the conceptual representation of a building including one or more user-defined floor levels comprises receiving user input defining a mass form model of the building.

16. The computer storage medium of claim 10, wherein the conceptual representation is a mass form model defined by the multiple surfaces, the mass form model including a geographic orientation of the building.

17. The computer storage medium of claim 10, wherein the predefined analytical energy model parameters include default values and are sufficient to generate the analytical energy model in combination with the conceptual representation.

18. The computer storage medium of claim 10, wherein receiving a conceptual representation of a building includes receiving conceptual representations of multiple buildings, each including one or more user-defined floor levels and multiple surfaces defining geometrical volumetric spaces, and wherein automatically generating the analytical energy model comprises automatically generating an analytical energy model for each of the multiple buildings.

19. A system comprising:
one or more computers operable to perform operations comprising:
receiving a conceptual representation of a building including one or more user-defined floor levels and multiple surfaces defining geometrical volumetric spaces; and
responsive to a request to generate an analytical energy model, automatically generating the analytical energy model by:
deriving geometric information from the conceptual representation;
based on the geometric information, defining one or more mass volumes;
algorithmically assigning one or more surface types to mass volume surfaces based, at least in part, on surface type definitions, a number of space adjacencies and the geometric information, associated with a corresponding mass volume surface, the surface type definitions specifying a material construction of a corresponding surface type;
defining one or more thermal mass zones based on the determined one or more mass volumes and a corresponding number of user-defined floor levels;
deriving, using a model generator, thermal properties of the one or more thermal mass zones;
wherein the deriving is based on the geometrical columetric spaces, the one or more surface types assigned to the mass volume surfaces, and corresponding material construction; and
combining the defined one or more thermal mass zones, the derived thermal properties, and predefined analytical energy model parameters to generate the analytical energy model.

20. The system of claim 19, wherein algorithmically assigning the one or more surface types comprises defining a glazed portion of an exterior surface based on a predefined glazing percentage.

21. The system of claim 19, wherein algorithmically assigning the one or more surface types comprises assigning a first surface type to a first portion of an exterior surface and assigning a second surface type to a second portion of the exterior surface.

22. The system of claim 19, the operations further comprising, for assigned surface types, associating the material construction of the surface type with a corresponding portion of an exterior surface in the conceptual representation.

23. The system of claim 19, wherein determining the one or more mass volumes comprises partitioning the one or more mass volumes into core mass volumes and perimeter mass volumes based on a specified distance between a perimeter of the core mass volume and a perimeter of a corresponding one of the one or more mass volumes.

24. The system of claim 19, wherein receiving the conceptual representation of a building including one or more user-defined floor levels comprises receiving user input defining a mass form model of the building.

25. The system of claim 19, wherein the conceptual representation is a mass form model defined by the multiple surfaces, the mass form model including a geographic orientation of the building.

26. The system of claim 19, wherein the predefined analytical energy model parameters include default values and are sufficient to generate the analytical energy model in combination with the conceptual representation.

27. The system of claim 19, wherein receiving a conceptual representation of a building includes receiving conceptual representations of multiple buildings, each including one or more user-defined floor levels and multiple surfaces defining geometrical volumetric spaces, and wherein automatically generating the analytical energy model comprises automatically generating an analytical energy model for each of the multiple buildings.

* * * * *

UNITED STATES PATENT AND TRADEMARK OFFICE
CERTIFICATE OF CORRECTION

PATENT NO. : 9,177,084 B2  
APPLICATION NO. : 13/250213  
DATED : November 3, 2015  
INVENTOR(S) : Kyle Bernhardt et al.

Page 1 of 1

It is certified that error appears in the above-identified patent and that said Letters Patent is hereby corrected as shown below:

In the claims

Column 13, line 29, claim 1: delete "definitions" and insert --definitions,--, therefor.

Column 13, line 39, claim 1: after "based" delete "one" and insert --on--, therefor.

Column 14, line 32, claim 10: delete "defining" and insert --determining--, therefor.

Column 14, line 37, claim 10: delete "information," and insert --information--, therefor.

Column 15, line 35, claim 19: delete "defining" and insert --determining--, therefor.

Column 15, line 40, claim 19: delete "information," and insert --information--, therefor.

Column 16, lines 1-2, claim 19: delete "columetric" and insert --volumetric--, therefor.

Signed and Sealed this  
First Day of March, 2016

Michelle K. Lee  
*Director of the United States Patent and Trademark Office*